United States Patent [19]

Sugawara et al.

[11] Patent Number: 4,933,059
[45] Date of Patent: Jun. 12, 1990

[54] PROCESS FOR PREPARING ANISOTROPIC RARE EARTH MAGNET MATERIAL

[75] Inventors: Eishu Sugawara; Taketoshi Nakayama; Tsuyoshi Masumoto, all of Sendai, Japan

[73] Assignees: Research Development Corporation of Japan, Tokyo; Tokin Corporation, Sendai, both of Japan

[21] Appl. No.: 312,746

[22] Filed: Feb. 17, 1989

Related U.S. Application Data

[62] Division of Ser. No. 63,334, Jun. 17, 1987, Pat. No. 4,836,867.

[30] Foreign Application Priority Data

Jun. 26, 1986 [JP] Japan .................. 61-148159

[51] Int. Cl.$^5$ ............................................ C23C 14/34
[52] U.S. Cl. .............................. 204/192.15; 204/192.2
[58] Field of Search .................. 204/192.12, 192.15, 204/192.2; 428/900

[56] References Cited

U.S. PATENT DOCUMENTS

| | | | |
|---|---|---|---|
| 4,367,257 | 1/1983 | Arai et al. | 204/192.2 X |
| 4,484,995 | 11/1984 | Pirich et al. | 204/298 X |
| 4,608,142 | 8/1986 | Gomi et al. | 204/192.2 |
| 4,610,770 | 9/1986 | Saito et al. | 204/192.1 |
| 4,640,755 | 2/1987 | Sato et al. | 204/192.2 |
| 4,764,436 | 8/1988 | Akutsu et al. | 428/900 X |
| 4,769,282 | 9/1988 | Tada et al. | 428/900 X |

FOREIGN PATENT DOCUMENTS

| | | |
|---|---|---|
| 0144851 | 6/1985 | European Pat. Off. . |
| 0167118 | 1/1986 | European Pat. Off. . |
| 1344379 | 1/1974 | United Kingdom . |

Primary Examiner—Nam X. Nguyen
Attorney, Agent, or Firm—Flynn, Thiel, Boutell & Tanis

[57] ABSTRACT

An anisotropic rare earth magnet material is provided by a sputtering technique. The material has structural and magnetic anisotropy. Its composition is represented essentially by the following formula:

$$(R_{1-a}O_a)_b M_{1-b}$$

wherein R means at least one of rare earth metal elements of Y and the lanthanide series of La, Ce, Pr, Nd, Pm, Sm, Eu, Gd, Tb, Dy, Ho, Er, Tm, Yb and Lu or a combination of Hf and at least one of the foregoing rare earth metal elements, M denotes Co or a combination of Co and at least one of Fe, Cu, Zr, Ti, Al and B, a is not greater than 0.05 (a≦0.05), and b ranges from 0.1 to 0.5 (b=0.1–0.5).

11 Claims, 15 Drawing Sheets

FIG.14-a
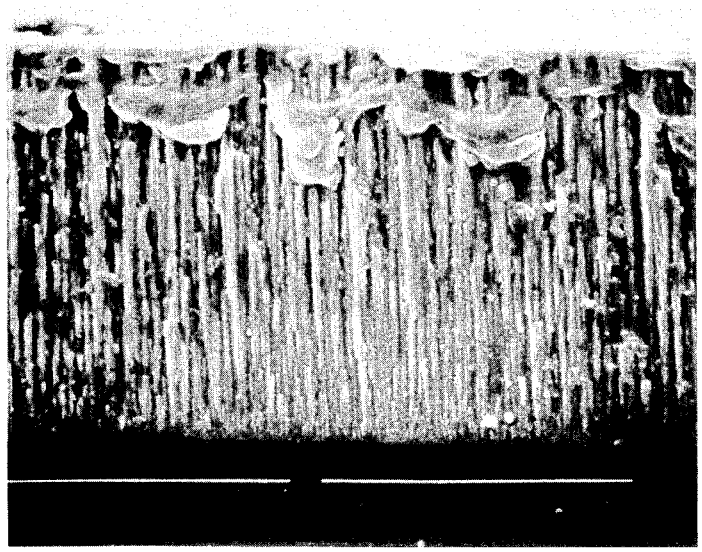
$$\frac{(5mm)}{1\mu m} \quad (\times 5000)$$
0.2kW x 10hr

FIG.14-b
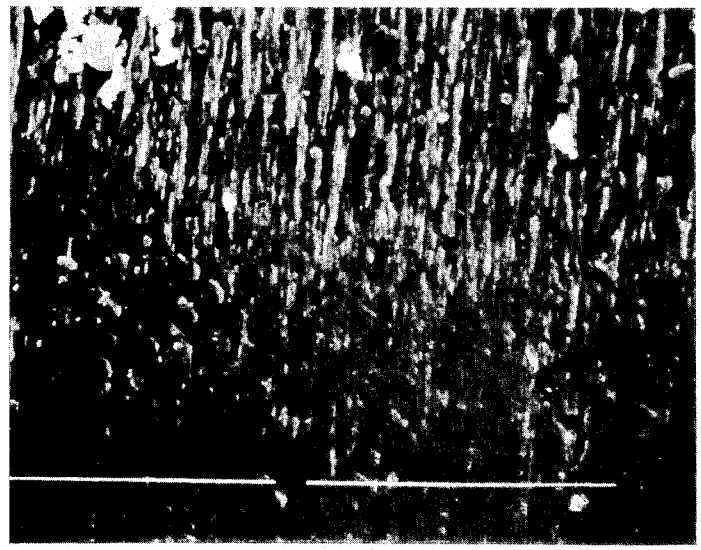
$$\frac{(5mm)}{1\mu m} \quad (\times 5000)$$
0.6kW×10hr.

FIG.14-c
$$\frac{(5mm)}{1\mu m} \quad (\times 5000)$$
1.0 kW × 10 hr

PROCESS FOR PREPARING ANISOTROPIC RARE EARTH MAGNET MATERIAL

This is a division of Ser. No. 063,334, filed June 17, 1987, now U.S. Pat. No. 4,836,867.

BACKGROUND OF THE INVENTION

1. Field of the Invention

This invention relates to an anisotropic rare earth magnet material having structural and magnetic anisotropy and also to a process for the production of same.

2. Description of the Prior Art

There are numerous intermetallic compounds of the rare earth metal(R)-Co type or the rare earth metal(R)-Fe type, including $RM_{13}$, $R_2M_{17}$, $RM_5$, $R_5M_{19}$, $R_2M_7$, $RM_3$, $RM_2$, $R_2M_3$, $R_2M_{1.7}$, $R_4M_3$, $R_{24}M_{11}$, $R_9M_4$, $R_3M$, etc., wherein M is Co or Fe. Their crystalline structures are diverse and include the cubic, hexagonal, orthorhombic and rhombohedral systems.

Rare earth magnets are magnet materials which contain both hexagonal and rhombohedral crystals, make use of $R_2M_{17}$, $RM_5$, $R_2M_7$, $RM_3$ and the like among intermetallic compounds in many instances, and have large crystalline and magnetic anisotropy. Compared with conventional Ba-ferrite magnets or Sr-ferrite magnets, Alnico-5, -6, -8 and -9 magnets, two-phase separated magnets of Fe-Cr-Co, Pt-Co magnets and Mn-Al-C magnets, their magnetic characteristics including those of both the $RM_5$ and $R_2M_{17}$ systems are significantly higher in coercive force IHc and maximum energy product (BH)max. The consumption of rare earth magnets has hence increased. Rare earth magnets have contributed considerably toward the size reduction of new industrial products and the improvements of their characteristics.

As the usual production processes of $RM_5$ and $R_2M_{17}$ which are produced currently, there may be mentioned primarily the sintering process and the polymer bonding process which makes use of a binder. According to the sintering process, raw materials are converted into roughly-ground powder by melting the raw materials or reducing oxidized powder directly. In order to protect rare earth metals which are active and susceptible to oxidation, the powder is finely ground into fine powder (5–20 μm) in an organic solvent such as silicone oil. After drying, the fine powder is press-formed along an axis of easy magnetization such as C-axis in a magnetic field of 10–30 kOe (800–2400 kA/m), followed by sintering, solid solution treatment and aging in a nonoxidizing atmosphere to obtain structural and magnetic anisotropy. In addition to the above-described magnetic field pressing method, the unidirectional solidification method in which a magnet material is formed from a melt by the Bridgeman method, high-frequency zone melting method or the like may also be mentioned as a method for orienting crystals in one direction.

The polymer bonding process was developed to overcome the drawback of brittleness of sintered magnets. A prismatic portion which has grown in one direction from a melt is ground. The thus-formed powder is then hardened thermally or chemically with a resin binder, a rubbery and thermoplastic binder, respectively.

A description will next be made of the mechanism of magnetization of a sintered magnet. In the above-described rare earth magnets, the mechanism of their coercive force generation may be discussed separately under two different situations. One of the situations arises when the coercive force is relatively low, i.e., about 6 kOe (480 kA/m). Under this situation, a cellular micro-structure is formed with a rhombohedral cell of $R_2M_{17}$ phase surrounded by boundaries of hexagonal crystals of $RM_5$. When the coercive force is large, namely, higher than 14 kOe [>14 kOe (>1120 kA/m)], the cell size increases and a thin lamellar layer of $RM_3$ occurs in a manner superposed in the cell structure. Namely, the reversal of magnetization takes place when new domain walls come out in crystal grains and then grow. Domain walls in the stage of their growth can move easily within their respective crystal grains. The above-mentioned cell boundaries however resist the movement of the domain walls, thereby exhibiting strong pinning action against the domain walls. The coercive force is determined by the size (500–2000 Å) of the cell. The coercive force is generally said to increase as the cell size becomes greater.

Magnetism as high as 30–35 MGOe (240–280 kJ/m$^3$) in terms of maximum energy product (BH)max is obtained at room temperature by such a mechanism of magnetization as described above. However, rare earth magnets are theoretically considered to have the capability to achieve (BH)max as large as 50–70 MGOe (400–560 kJ/m$^3$). As a matter of fact, $Dy_3Al_2$ has been found to show a coercive force of 20 kOe (1600 kA/m), namely, (BH)max of 73 MGOe (584 kJ/m$^3$) at a low temperature (the temperature of liquefied helium). The mechanism of this magnetization is believed to be different from the conventional theory. Judging also from the fact that this phenomenon is very remarkable at low temperatures but the magnetism is reduced due to thermal agitation when the temperature is high, the pinning action against domain walls is not attributed solely to cell boundaries as has been observed in the conventional mechanism of magnetization but may also be attributed to stacking fault, Guinier-Preston (G.P.) zone and phase boundaries and also to dislocation, etc. Owing to this pinning action, the magnetism to be produced seems to reach a value close to the theoretical value and the mechanism of its magnetization is believed to differ from the present theory of magnetism.

Although the above-described sintering process has such merits that it is excellent in mass productivity, features high yield and can easily meet the requirement for various shapes, the sintering process tends to cause oxidation of powder being processed because the powder is fine, it is difficult to control oxygen in the grinding, drying and heat treatment steps. Since the powder is pressed and then sintered, it is technically difficult to obtain thin products of 1 mm and less due to slipping upon pressing, cracking upon sintering and the brittleness inherent to metal compounds. In addition, the powder oriented along the C-axis upon its sintering grows in random directions. The anisotropy is therefore prone to disturbance and the magnetism is deteriorated accordingly.

On the other hand, the polymer bonding process is accompanied by drawbacks that the magnets are thermally unstable (maximum service temperature: 200° C.) and compared with sintered magnets, have lower densities and lower magnetic characteristics.

SUMMARY OF THE INVENTION

In one aspect of this invention, there is thus provided an anisotropic rare earth magnet material having structural and magnetic anisotropy and a composition represented essentially by the following formula:

$$(R_{1-a}O_a)_b M_{1-b}$$

wherein R means at least one of rare earth metal elements of Y and the lanthanide series of La, Ce, Pr, Nd, Pm, Sm, Eu, Gd, Tb, Dy, Ho, Er, Tm, Yb and Lu or a combination of Hf and at least one of the foregoing rare earth metal elements, M denotes Co or a combination of Co and at least one of Fe, Cu, Zr, Ti, Al and B, a is not greater than 0.05 ($a \leq 0.05$), and b ranges from 0.1 to 0.5 ($b = 0.1 - 0.5$).

By artificially controlling the crystalline structure to contain oxides, the present invention has developed pinning action against domain walls and created the domain structure.

In another aspect of this invention, there is also provided a process for the production of an anisotropic rare earth magnet material, which comprises:

(i) providing in an Ar atmosphere a target having a composition represented essentially by the following formula:

$$(R_{1-a}O_a)_b M_{1-b}$$

wherein R means at least one of rare earth metal elements of Y and the lanthanide series of La, Ce, Pr, Nd, Pm, Sm, Eu, Gd, Tb, Dy, Ho, Er, Tm, Yb and Lu or a combination of Hf and at least one of the foregoing rare earth metal elements, M denotes Co or a combination of Co and at least one of Fe, Cu, Zr, Ti, Al and B, a is not greater than 0.05 ($a \leq 0.05$), and b ranges from 0.1 to 0.5 ($b = 0.1 - 0.5$); and (ii) applying an a.c. or d.c. electric field between the target and a substrate in accordance with a sputtering technique, whereby a material having structural and magnetic anisotropy is formed on the substrate.

According to the present invention, an electric field is applied between a target and its associated substrate. Atoms, which have been thrown out of the target as a result of $Ar^-$ bombardment, are allowed to deposit and grow on the substrate. Here, crystallization is believed to take place by heat so that the hexagonal structure grows. By the anisotropy in composition owing to the growth of prismatic crystals and the existence of the hexagonal structure grown in the direction of the C-axis, a sputtered anisotropic magnet is therefore provided. The present invention has very important industrial significance in that an anisotropic magnet is produced directly from a vapor phase.

There are numerous industrial applications of this invention. Since the magnet material of this invention can provide smaller magnets, it is useful as magnets for micromotors, bias magnets like magnetoresistors, a magnetostrictive material, etc. The magnet material of this invention can be secured directly to substrates. Various processing and machining steps can hence be omitted, leading to simplification of the processing and machining and also to a reduction to the manufacturing cost. As an extension of the sputtering technique, the process of the present invention is effective for the production of materials which cannot be machined into thin sheets, especially, thick films (300–500 μm).

BRIEF DESCRIPTION OF THE DRAWINGS

The above and other objects, features and advantages of the present invention will become apparent from the following description and the appended claims, taken in conjunction with the accompanying drawings, in which:

FIGS. 14-a to 14-b are electron micrographs showing the metal structures of sputtered films formed at different sputtering outputs;

DETAILED DESCRIPTION OF THE PREFERRED EMBODIMENTS

Figure 1:
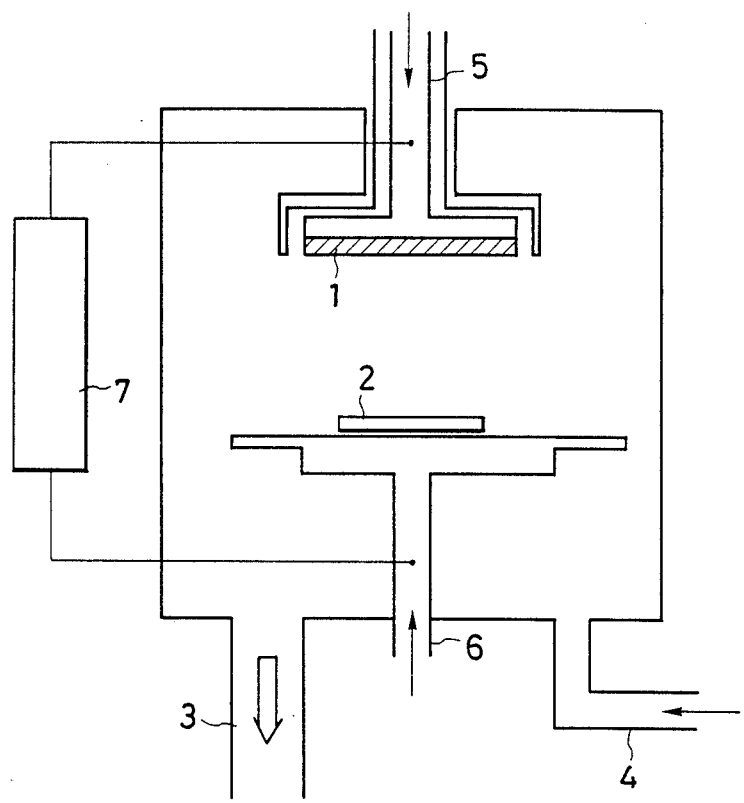
FIG. 1 schematically illustrates a radio frequency (hereinafter abbreviated as "rf") sputtering apparatus suitable for use in the practice of this invention.

As methods for artificially controlling the crystalline structure, there may be mentioned the liquid quenching method in which a melt is blown against a roll, sputtering, and ion plating methods, such as vacuum evaporation, chemical vapor deposition (CVD), molecular beam epitaxy, arc plasma plating, cluster ion beam plating, etc. In view of the easiness and reproducibility upon controlling the thickness and temperature of a material to be formed and its transformation of amorphous phase→non-equilibrium phase→crystalline phase, rf sputtttering has been found most suitable. Needless to say, other methods are also applicable.

It is also possible to use the opposed targets technique in which targets are disposed opposite to each other. Owing to the opposing arrangement of the targets, the generation of plasma is increased compared with the use of a single target. As a result, more plasma is allowed to flow toward substrates arranged around the targets and the deposition rate becomes higher than that available by usual rf-sputtering techniques. The opposed targets technique is therefore preferred.

A description will next be made of a process for the production of targets useful in the practice of this invention.

The composition of the anisotropic rare earth magnet material of this invention is (RO)M. Therefore, R and O are in an nonseparable relation. Needless to say, inclusion of O is said to give influence to the formation of prismatic crystals. An $R_{1-a}O_b$ compound is said to be effective in the pinning of domain walls and is hence effective for the improvement of coercive force. It is therefore essential for the compound to contain O in an amount of 5% or less. O is however very reactive with rare earth metals and the crystalline structure, magnetic characteristics and the like are affected by variations in the O content. In order to achieve a desired O content, the proportion of O is adjusted upon preparation of targets.

For the preparation of targets, a rare earth metal R of 99.9% purity and several kinds of metals M of 99.99% purity are weighed first of all. They are subjected to induction melting in an Ar atmosphere. After stirring the resultant melt into a homogeneous melt, the homogeneous melt is cast in a mold. The thus-obtained ingot is coarsely ground to pass through a 48 mesh screen or so and is then finely ground to 5–20 μm particles in an organic solvent by means of an attritor, ball mill or the like. After drying, the resultant powder is press-formed and then sintered so that the content of oxygen can be controlled at a desired level. The sintered targets are bonded respectively to target holders, whereby the preparation and setting of the targets are completed.

Substrates will next be described. As substrates, there are metal (Cu, Al) substrates, fine polymer substrates, fine ceramics substrates, ceramic porcelain substrates, quartz glass substrates, "Pyrex" (trade mark) substrates, sheet glass (usual soda glass) substrates, Si substrates, carbon substrates, etc. These substrates can all be used satisfactorily. Glass substrates such as sheet glass were provided as samples, because such glass substrates are most suitable in view of their lower prices and good processability and their high applicability for measurement of various physical properties.

Using the target and substrate as described above, rf sputtering is conducted. The outline construction of a sputtering apparatus usable in the practice of this invention is schematically shown in FIG. 1. This sputtering apparatus is used to conduct the usual sputtering method in which a target 1 and a substrate 2 are arranged opposite to each other. Sputtering is effected in the following sequence. First, the sputtering apparatus is roughly evacuated through an exhaust pipe 3 by means of a rotary pump (not shown). Vacuum evacuation is then conducted to about $2 \times 10^{-6}$ torr by an unillustrated diffusion pump. Ar gas is fed through a pipe 4 so as to purge the interior gas with Ar gas, so that the interior pressure is maintained at $1-5 \times 10^{-2}$ torr. After etching and cleaning the substrate 2 and target 1, sputtering is started so that (RO)M begins to deposit on the substrate 2. The deposition rate varies depending on the energy of the radio frequency. The quantity of a deposit increases linearly as the time goes on. In FIG. 1, designated at numerals 5, 6 are feed tubes for cooling water while numeral 7 indicates a high-frequency power source.

Figure 2:
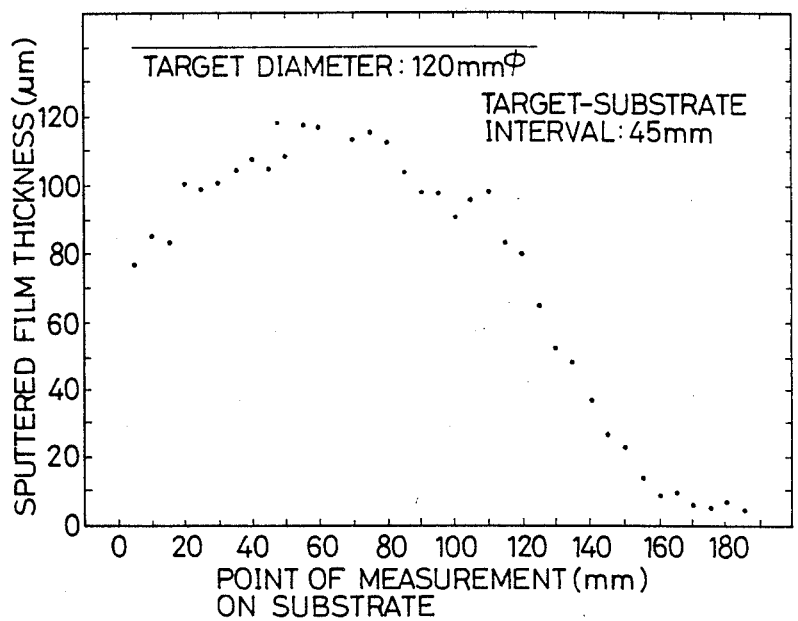
FIG. 2 diagrammatically illustrates measurement results of the thickness distribution of sputtered films.

FIG. 2 illustrates, by way of example, the thickness distribution of a film sputtered by using a target the diameter of which was 120 mm. A parabolic distribution curve is shown. A dial gauge with graduations in μm was used for the measurement of the film thickness.

Figure 3:
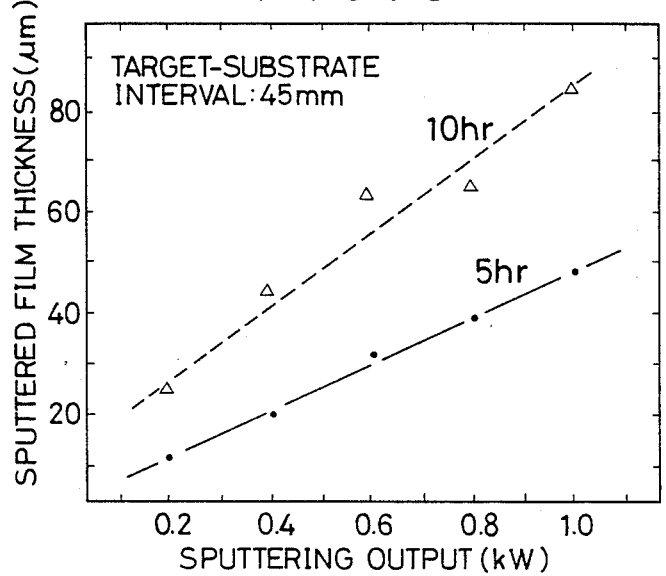
FIG. 3 is a graph showing the sputtering output and time dependency of the thickness of a sputtered film.

FIG. 3 depicts the relation between film thickness and rf-sputtering output and time. Each output was read from a meter of an rf power source. Plotted dots correspond to points right underneath the target, where maximum values were obtained respectively. The film thickness is substantially in a linear relation with both sputtering time and sputtering output.

The composition of each sputtered film was then studied by usual X-ray fluorescence analysis and chemical analysis in combination. The X-ray fluorescence analysis was carried out by preparing a calibration curve with a standard sample. The chemical analysis was conducted by a wet method. Oxygen was measured using a gas analyzer Coulomatic "O" (trade name). Each sample was removed from its corresponding glass substrate and was then subjected to the measurements.

Figure 4:
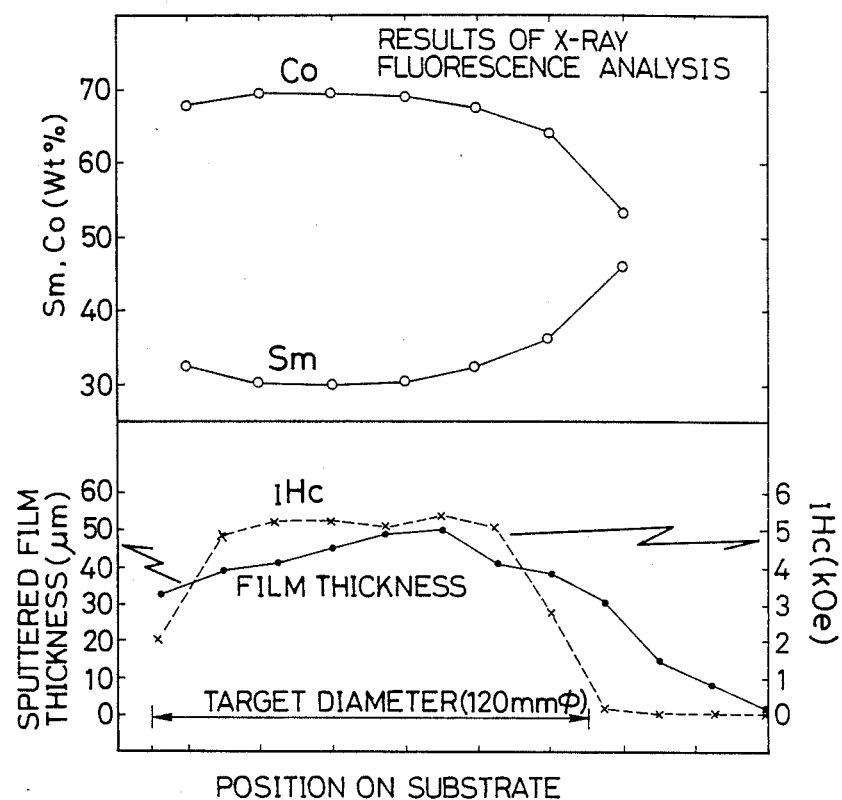
FIG. 4 diagrammatically shows the relation between the composition, thicknesses and IHc of a sputtered (SmO)Co film.

Results of the X-ray fluorescence analysis of a ternary system (SmO)R are shown by way of example in FIG. 4. Shown below the results of the composition analysis is a graph illustrating the relation between the film thickness and the IHc determined from the measurement of the B-H magnetic characteristic. The composition of the target employed was Sm: 36.5%, O: 1.0% and Co: balance. As the film thickness decreased, the proportions of Sm and O tended to increase while the proportion of Co inclined to decrease. X-ray fluorescence analysis cannot provide any correct analysis data when the film thickness increases to about 20 μm. X-ray fluorescence analysis was therefore unable to determine the exact relation between film thickness and composition. The oxygen content increased about 1.5 times compared with the oxygen content of the target. This can also be attributed to leakage of the sputtering apparatus and segregation of oxygen in the sintered target. As a result of an EPMA analysis, it was confirmed that oxygen is dispersed almost uniformly in the sputtered film.

Figure 5:
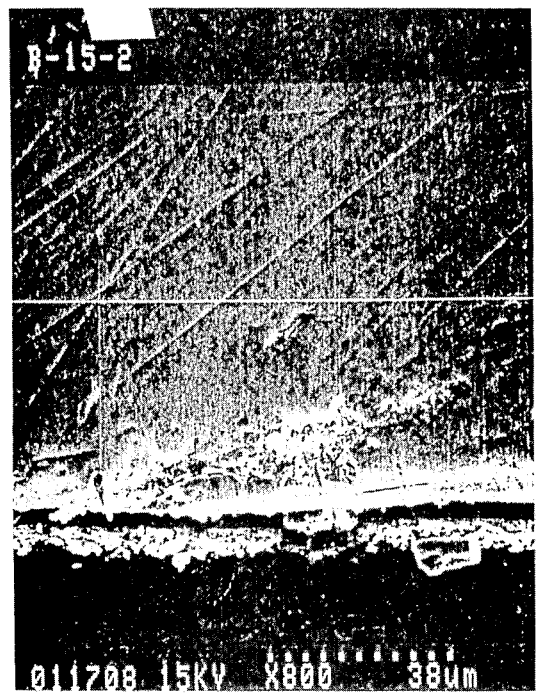
FIG. 5 is a line analysis electron micrograph of the metal structure of the sputtered (SmO)Co film.
Figure 8:
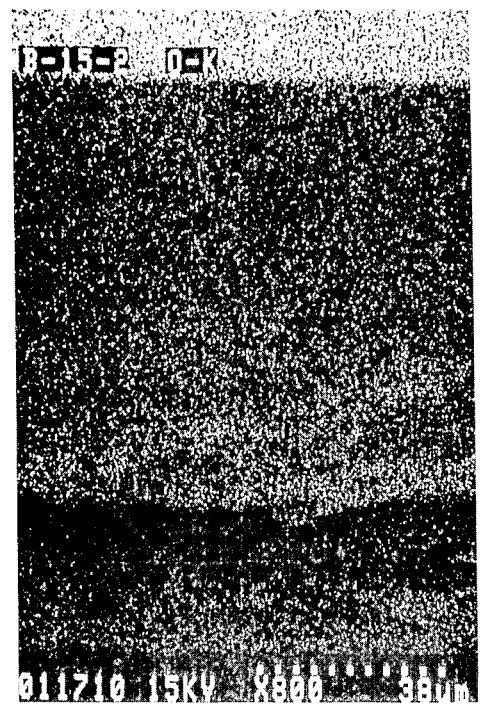
FIG. 8 is an electron micrograph showing results of a plane analysis of oxygen in the metal structure of the (SmO)Co sputtered film.
Figure 6:
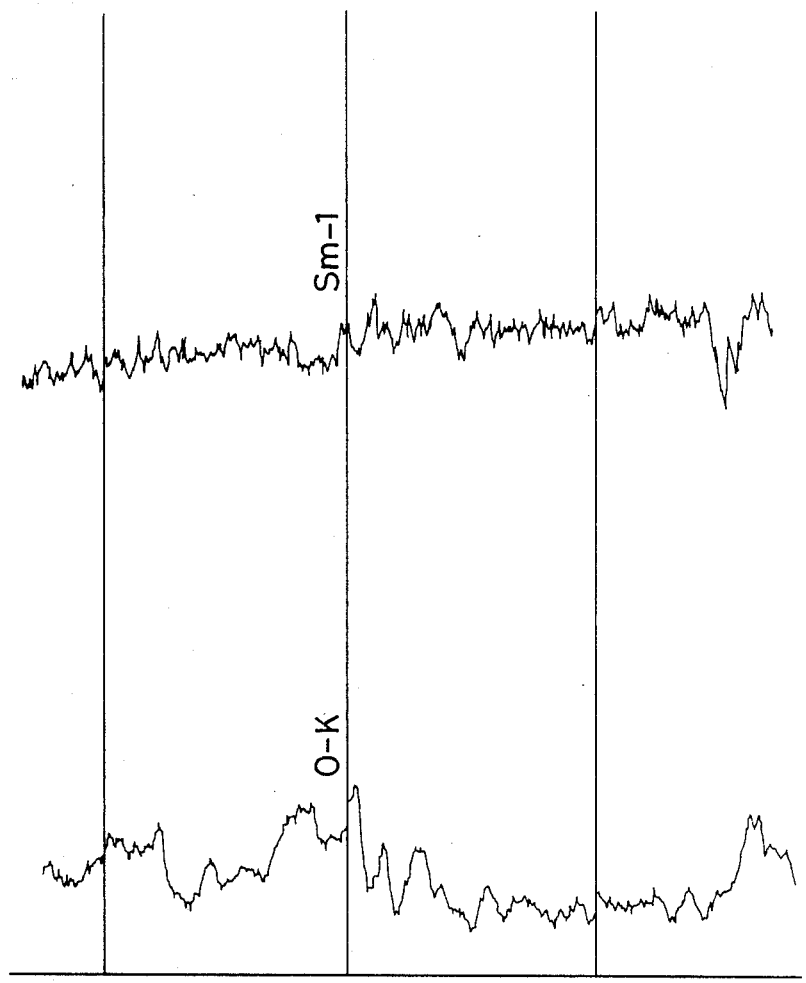
FIG. 6 is a graph depicting results of line analyses of Sm and O in the (SmO)Co sputtered film.
Figure 7:
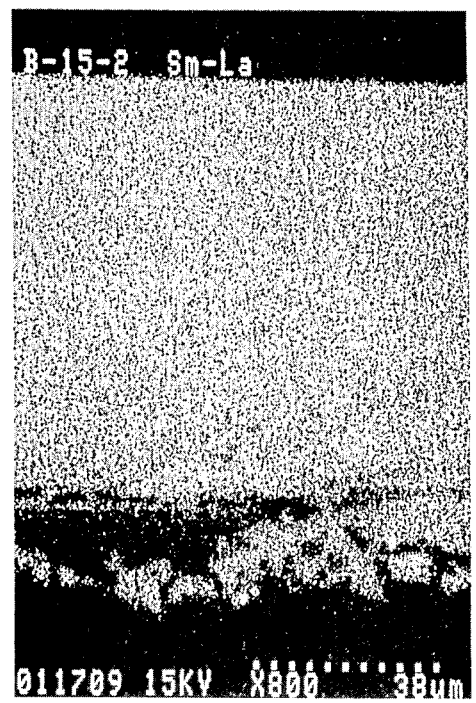
FIG. 7 is an electron micrograph showing results of a plane analysis of Sm in the metal structure of the (SmO)Co sputtered film.

FIG. 5 is a line analysis scanning electron micrograph of the sputtered (SmO)Co film, FIG. 6 shows results of line analyses, FIG. 7 depicts results of a plane analysis of Sm, and FIG. 8 illustrates results of a plane analysis of oxygen. From the results of the line analysis, Sm and oxygen are both substantially uniformly dispersed. Also, based on the results of the plane analyses, their dispersion is also considered to be uniform substantially from the boundary with the glass substrate to the entire area of the sputtered film.

The crystalline structure of the thus-sputtered film will next be described. As also shown in FIG. 2, it has been found that the thickness distribution of a film varies depending on the position on an associated substrate, the sputtering temperature changes in accordance with the sputtering output and time, and the crystalline structure is affected accordingly.

Figure 9:
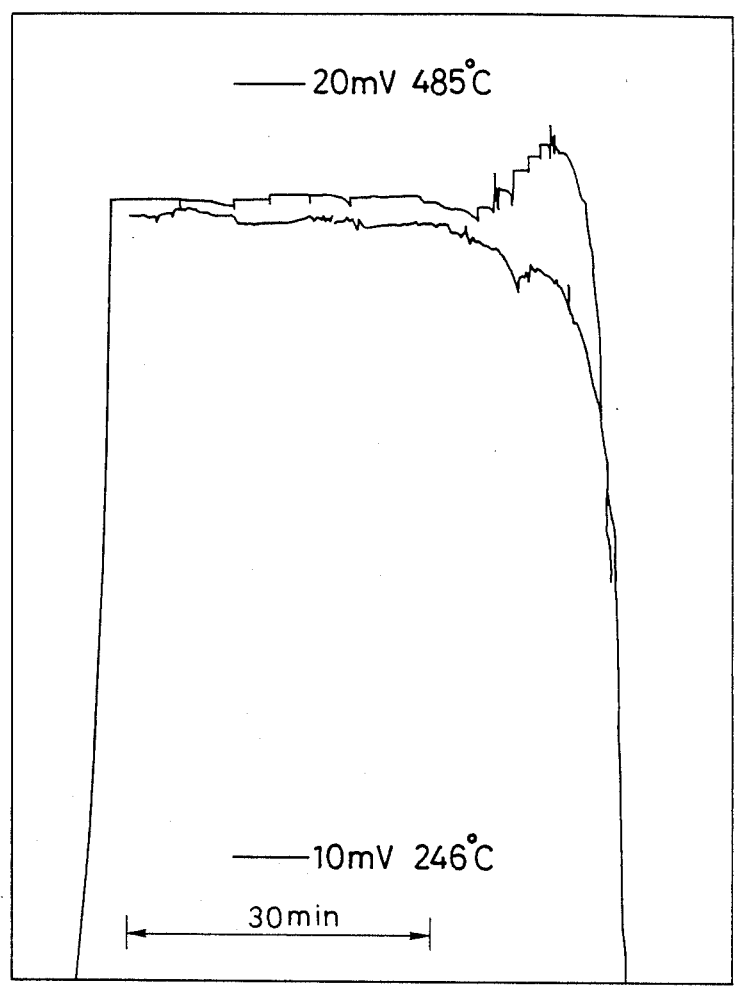
FIG. 9 shows diagrammatically temperature variations on a substrate.
Figure 10:
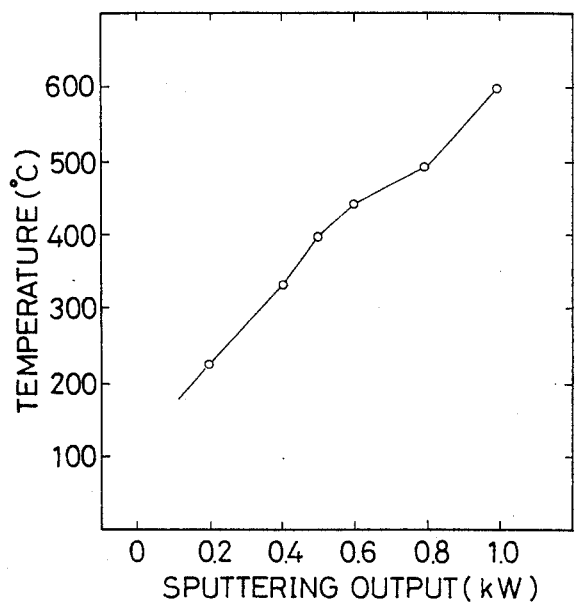
FIG. 10 is a graph showing the temperature of the substrate as a function of the sputtering output.
Figure 11:
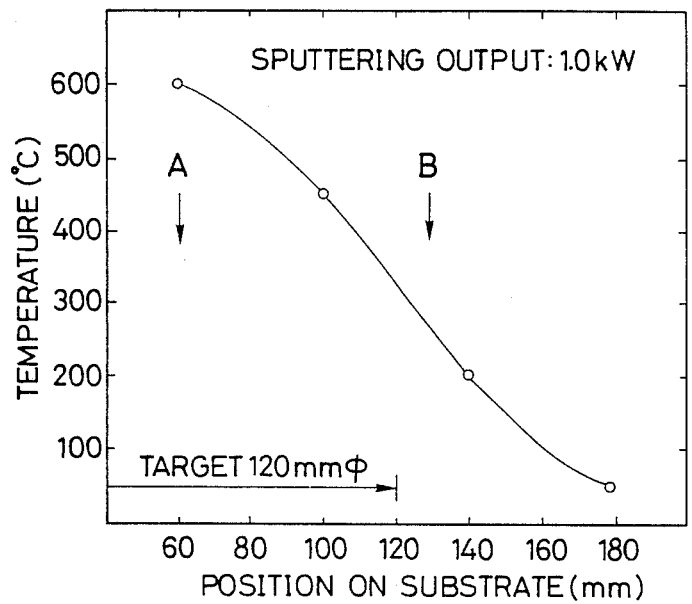
FIG. 11 is a graph showing the temperature change of the substrate depending on positions on the substrate.
Figure 12:
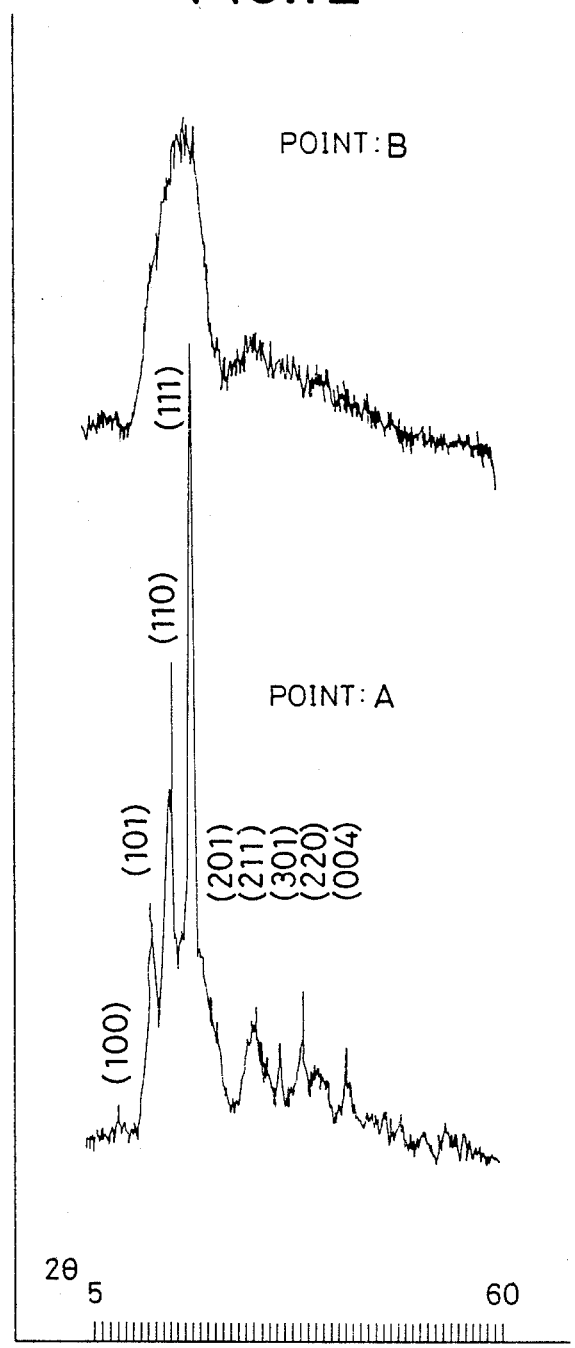
FIG. 12 diagrammatically illustrates differences in crystalline structure depending on positions on the substrate.
Figure 13:
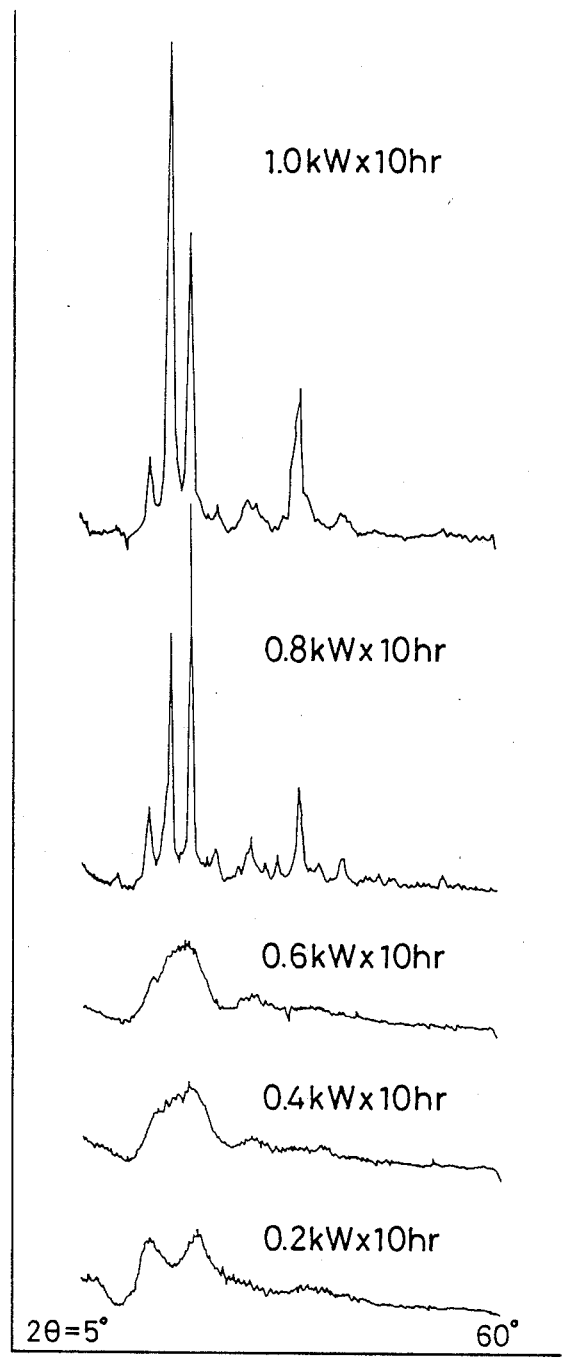
FIG. 13 is a graph showing results of X-ray diffraction analyses of sputtered films formed at varied sputtering outputs respectively.

FIG. 9 shows measurement results of temperature variations on a glass substrate, which occurred by the initiation and stop of sputtering. Sudden temperature jump and drop are both observed. By providing a thermocouple on a substrate right underneath a target, output-dependent temperature variations were then measured. Results are shown in FIG. 10. The temperature of the substrate increased almost linearly in proportion to the sputtering output and reached about 600° C. at 1.0 kW-hour. The temperature distribution on the substrate was also investigated. The temperature changed considerably depending on positions with respect to the target as shown in FIG. 11. Outside the outer periphery of the target, the temperature dropped. As a result, the crystalline structure of the sputtered film changed. The crystalline structures at Point A (corresponding to a target center) and Point B (10 mm apart from the outer periphery of the target) in FIG. 11 are respectively shown in FIG. 12. At Point A, the sputtered film had a crystalline structure with 2-17 phase. At Point B, a diffraction pattern characteristic to an amorphous structure was shown. Namely, the difference between the crystalline structures at Points A and B in FIG. 12 is believed to be affected considerably by the temperature of the substrate in view of the variations in composition shown in FIG. 4 and the measurement results of temperature distribution in FIG. 11. Namely, crystallization takes place to undergo crystal growth into an intermetallic compound such as 2-17 phase when the temperature of the substrate is high upon sputtering. Outside the outer periphery of the target, the temperature of the substrate is too low to crystallize a sputtered film, so that the sputtered film takes an amorphous structure. This also arises when the temperature of a substrate is changed by varying the sputtering output. FIG. 13 shows results of X-ray analyses which were conducted by changing the sputtering output in five stages from 0–1.0 kW. As the sputtering output increased, more peaks appeared in the diffraction pattern of the amorphous structure and their intensities became stronger. The planes corresponding to the thus-produced peaks can be identified as hexagonal crystals by indexes in accordance with the Hull-Davey's chart. When the targets used were 2-7 phase (40% Sm) and 1-5 phase (36% Sm), it seemed that their crystalline structures in the high temperature range remained to have the hexagonal system instead of the rhombohedral system even after the temperature was lowered to room temperature.

The structures and magnetic characteristics of sputtered films will next be described. FIGS. 14-a, 14-b and 14-c show scanning electron micrographs of broken-out sections of films prepared by conducting sputtering at outputs of 0.2, 0.6 and 1.0 kW, respectively, for 10 hours. Under each of these output conditions, a prismatic crystalline structure of about 0.5 $\mu$m wide is observed. Accordingly, little differences in width appear to arise depending on the sputtering output. It has been confirmed from the above observation that the structure of each sputtered film contained prismatic crystals in the direction perpendicular to its corresponding substrate and was hence anisotropic structurally.

Figure 15:
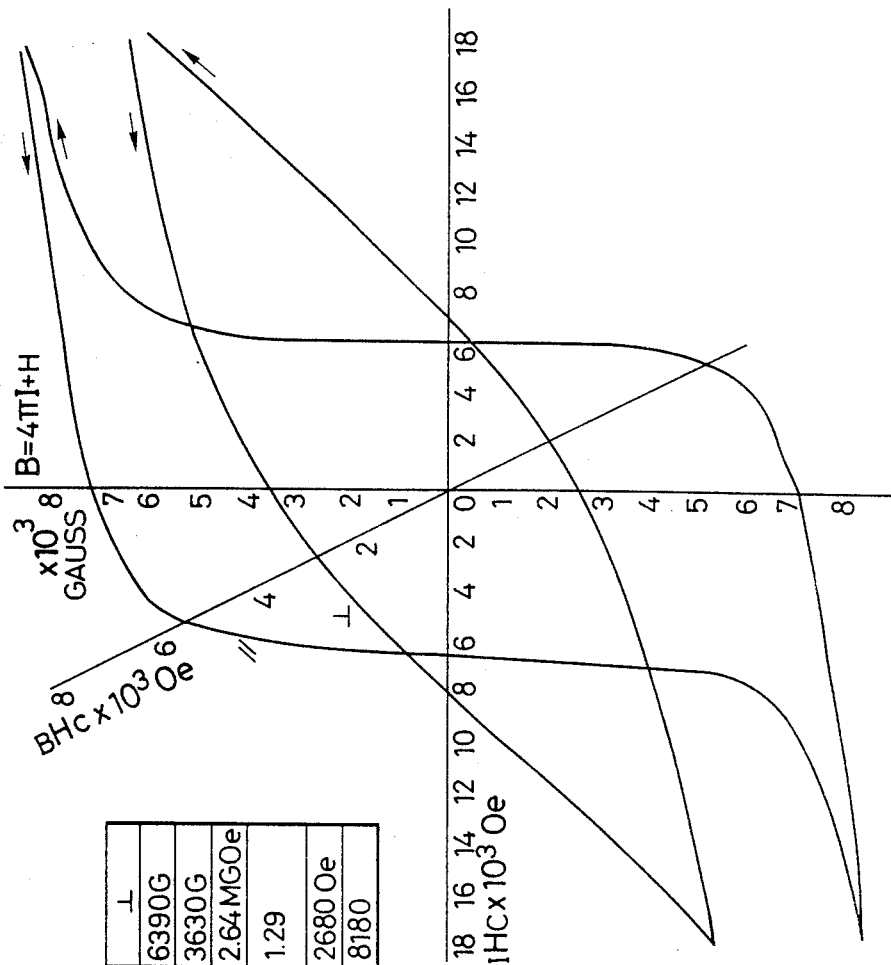
FIG. 15 is a B-H curve of a sputtered Sm-Co film.

FIG. 15 shows a B-H curve measured by a vibrating sample magnetometer (VSM). The sample measured was obtained from a portion of a sputtered film, which portion lied right underneath the associated target. It was then cut into a desired shape. The film thickness was then measured by a dial gauge and its volume and weight were calculated roughly from the densities of the glass substrate and sputtered film. Included in the characteristics measured were $4\pi Is$, $4\pi Ir$, (BH)max, BHc, IHc and HK (H at $4\pi Ir$ x 0.9: squareness), all at Hm=18 kOe (1440 kA/m). These characteristics were measured in directions parallel and perpendicular to the substrate.

Figure 16:
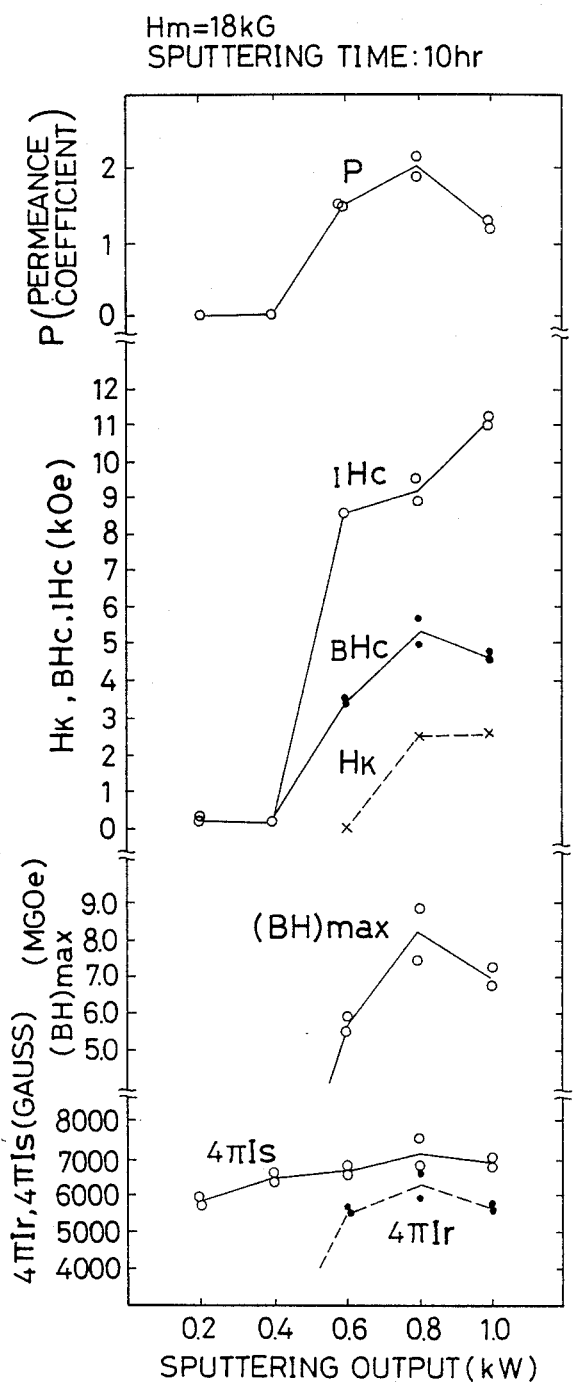
FIG. 16 is a graph showing magnetic characteristics (horizontal direction) as a function of the sputtering output.

FIG. 16 illustrates magnetic characteristics when the sputtering output was changed. $4\pi Is$ at Hm=18 kOe (1400 kA/m) remained substantially constant irrespective of the sputtering output, but $4\pi Ir$, (BH)max, IHc, BHc and HK were improved at the sputtering outputs of 0.6 kW and higher. Similar to the results of the X-ray diffraction, it seems to be possible to conclude that magnetic characteristics as a magnet material were developed as the crystallization went on.

The present invention will hereinafter be described in further detail by the following Examples.

EXAMPLE 1

An alloy, the composition of which was 35 wt. % Sm and the balance Co, was subjected to induction melting in an Ar atmosphere. The resultant ingot was coarsely ground by a stamp mill and then finely ground in silicone oil into powder having an average particle size of 10–15 $\mu$m. After drying, the fine powder was press-formed in a mold having an outer diameter of 140 mm. The green compact was sintered at 1100° C. for 1 hour in vacuum or in an atmosphere of an inert gas and was then allowed to cool down in the same furnace. The composition of the thus-obtained sintered body was 35 wt. % Sm, 0.9 wt. % O and the balance Co. Its diameter was 120 mm. Both upper and lower sides of the sintered body were polished to provide a target.

Sputtering was conducted in a vacuum of $2 \times 10^{-2}$ torr in an Ar atmosphere. The sputtering was continued for 50 hours at a sputtering output of 0.8 kW. As a result, a sputtered film was deposited to a thickness of 350 $\mu$m. Its magnetic characteristics were measured by a VSM in a direction parallel to the sputtered surface. The following results were obtained.

Br: 8500 Gausses (0.85 Tesla)
(BH)max: 9.9 MGOe (79.2 kJ/m$^3$)
BHc: 3000 Oe (240 kA/m)
IHc: 4400 Oe (352 kJ/m$^3$)
HK: 1400 Oe (112 kA/m)

EXAMPLE 2

An alloy, the composition of which was 40 wt. % Sm and the balance Co, was processed in the same manner as in Example 1, thereby obtaining a sintered body. The composition of the thus-obtained sintered body was 40 wt. % Sm, 1.1 wt. % O and the balance Co and its diameter was 120 mm.

A target was fabricated with the above-obtained sintered body. Sputtering was then conducted at 0.8 kW for 5 hours. The film thickness reached 38 $\mu$m and the following results were obtained.

Br: 6500 Gausses (0.65 Tesla)
(BH)max: 6.0 MGOe (48 kJ/m$^3$)
BHc: 4000 Oe (320 kA/m)
IHc: 10700 Oe (856 kA/m)

EXAMPLES 3–9

In the same manner as in Examples 1 and 2, the following samples were prepared and their magnetic characteristics were measured. The following data were obtained.

| Example No. | Resultant composition (wt. %) | Film thickness ($\mu$m) |
|---|---|---|
| 3 | $Nd_{35}Fe_{15}Co_{bal}B_2O_{0.7}$ | 150 |
| 4 | $Pr_{33}Fe_{14}Co_{bal}B_4O_{0.6}$ | 170 |
| 5 | $Gd_{36}Fe_{15}Co_{bal}B_3O_{0.8}$ | 350 |
| 6 | $Tb_{34}Fe_{12}Co_{bal}B_1O_{2.1}$ | 500 |
| 7 | $La_{34}Fe_{16}Co_{bal}B_5O_{1.5}$ | 100 |
| 8 | $Ce_{35}Fe_{15}Co_{bal}B_2O_{0.9}$ | 300 |

| Example No. | Magnetic Characteristics | | | |
| --- | --- | --- | --- | --- |
| | Br Gauss (Tesla) | (BH)max MGOe (kJ/m$^3$) | BHc Oe (kA/m) | IHc Oe (kA/m) |
| 3 | 16000 (1.6) | 30 (240) | 2000 (160) | 3000 (240) |
| 4 | 11000 (1.1) | 24 (192) | 3000 (240) | 6000 (480) |
| 5 | 6000 (0.6) | 10 (80) | 2000 (160) | 4000 (320) |
| 6 | 5000 (0.5) | 12 (96) | 3500 (280) | 5000 (400) |
| 7 | 7000 (0.7) | 7 (56) | 1300 (104) | 2300 (184) |
| 8 | 6000 (0.6) | 5 (40) | 1000 (80) | 3000 (240) |

Having now fully described the invention, it will be apparent to one of ordinary skill in the art that many changes and modifications can be made thereto without departing from the spirit or scope of the invention as set forth herein.

What is claimed is:

1. A process for the production of an anisotropic rare earth magnet material, which comprises:
   (i) providing in an Ar atmosphere a target consisting essentially of a composition having the following formula:

$$(R_{1-a}O_a)_b M_{1-}$$

wherein R is (1) at least one rare earth metal element selected from the group consisting of Y, La, Ce, Pr, Nd, Pm, Sm, Eu, Gd, Tb, Dy, Ho, Er, Tm, Yb and Lu, or (2) a combination of Hf and at least one of said rare earth metal elements, M is (1) Co, or (2) a combination of Co and at least one of Fe, Cu, Zr, Ti, Al and B, a is from 0.02 to 0.05, and b is from 0.1 to 0.5; and
   (ii) while maintaining said target and said substrate in said Ar atmosphere, applying an a.c. or d.c. electric field between said target and a substrate in accordance with a sputtering technique, under conditions effective to form on said substrate a material of said composition, said material being a magnetic film exhibiting structural and magnetic anisotropy and comprising a hexagonal crystalline phase.

2. A process as claimed in claim 1 in which said material is anisotropic both structurally and magnetically, and said material has a prismatic crystalline structure.

3. A process as claimed in claim 1 in which said material is anisotropic both structurally and magnetically, and said material has a multiphase structure of amorphous structural phase and hexagonal structural phase.

4. A process as claimed in claim 1 wherein a is from 0.0217 to 0.0423, and b is from 0.355 to 0.411.

5. A process as claimed in claim 1 in which said composition is selected from the group consisting of $$Sm_{35}O_{0.9}Co_{balance}, \text{ and}$$

$$Sm_{40}O_{1.1}Co_{balance}.$$

6. A process as claimed in claim 1 in which said composition is $$Gd_{36}Fe_{15}Co_{bal}B_3O_{0.8}.$$

7. A process as claimed in claim 1 in which said composition is $$La_{34}Fe_{16}Co_{bal}B_5O_{1.5}.$$

8. A process as claimed in claim 1 in which said composition is $$Ce_{35}Fe_{15}Co_{bal}B_2O_{0.9}.$$

9. A process as claimed in claim 1 in which the sputtering technique is rf sputtering under an Ar gas pressure of from 1 to $5 \times 10^{-2}$ torr.

10. A process as claimed in claim 1 in which said target is prepared by sintering particles of an alloy consisting of the R and M metals, under conditions effective to form said composition.

11. A process as claimed in claim 1 in which said target contains from 33 to 40 percent by weight of R.

* * * * *

UNITED STATES PATENT AND TRADEMARK OFFICE
CERTIFICATE OF CORRECTION

PATENT NO. : 4 933 059
DATED : June 12, 1990
INVENTOR(S) : Eishu SUGAWARA et al

It is certified that error appears in the above-identified patent and that said Letters Patent is hereby corrected as shown below:

Column 9, line 23; change "$(R_{1-a}O_a)_bM_{1-}$" to ---$(R_{1-a}O_a)_bM_{1-b}$---.

Signed and Sealed this

Twenty-eighth Day of January, 1992

Attest:

HARRY F. MANBECK, JR.

*Attesting Officer*   *Commissioner of Patents and Trademarks*